United States Patent
Ware et al.

(10) Patent No.: US 11,900,981 B2
(45) Date of Patent: *Feb. 13, 2024

(54) PROTOCOL FOR REFRESH BETWEEN A MEMORY CONTROLLER AND A MEMORY DEVICE

(71) Applicant: Rambus Inc., San Jose, CA (US)

(72) Inventors: Frederick A. Ware, Los Altos Hills, CA (US); Brent Haukness, Monte Sereno, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/078,934

(22) Filed: Dec. 10, 2022

(65) Prior Publication Data
US 2023/0223067 A1 Jul. 13, 2023

Related U.S. Application Data

(63) Continuation of application No. 17/115,538, filed on Dec. 8, 2020, now Pat. No. 11,551,741, which is a continuation of application No. 16/692,069, filed on Nov. 22, 2019, now Pat. No. 10,892,001, which is a continuation of application No. 16/032,575, filed on
(Continued)

(51) Int. Cl.
*G06F 12/00* (2006.01)
*G11C 11/406* (2006.01)
*G06F 13/16* (2006.01)

(52) U.S. Cl.
CPC .... *G11C 11/40611* (2013.01); *G06F 13/1636* (2013.01); *G11C 11/406* (2013.01); *G11C 11/40615* (2013.01); *G11C 11/40618* (2013.01); *G11C 2211/4067* (2013.01); *Y02D 10/00* (2018.01)

(58) Field of Classification Search
CPC ............ G11C 11/40611; G11C 11/406; G11C 11/40615; G11C 11/40618; G11C 2211/4067; G06F 13/1636; Y02D 10/14
See application file for complete search history.

(56) References Cited

U.S. PATENT DOCUMENTS 4,818,932 A 4/1989 Odenheimer
5,261,068 A 11/1993 Gaskins et al.
(Continued)

OTHER PUBLICATIONS

Information Disclosure Statement dated Sep. 27, 2011 re U.S. Appl. No. 13/257,412. 6 Pages.
(Continued)

*Primary Examiner* — Arvind Talukdar

(57) ABSTRACT

The present embodiments provide a system that supports self-refreshing operations in a memory device. During operation, the system transitions the memory device from an auto-refresh state, wherein a memory controller controls refreshing operations for the memory device, to a self-refresh state, wherein the memory device controls the refreshing operations. While the memory device is in the self-refresh state, the system sends progress information for the refreshing operations from the memory device to the memory controller. Next, upon returning from the self-refresh state to the auto-refresh state, the system uses the progress information received from the memory device to control the sequencing of subsequent operations by the memory controller.

20 Claims, 7 Drawing Sheets

Related U.S. Application Data

Jul. 11, 2018, now Pat. No. 10,510,395, which is a continuation of application No. 13/257,412, filed as application No. PCT/US2010/030166 on Apr. 7, 2010, now abandoned.

(60) Provisional application No. 61/171,576, filed on Apr. 22, 2009.

(56) References Cited

U.S. PATENT DOCUMENTS

| | | |
|---|---|---|
| 5,713,006 A | 1/1998 | Shigeeda |
| 6,118,719 A | 9/2000 | Dell et al. |
| 6,233,192 B1 | 5/2001 | Tanaka |
| 6,378,018 B1 | 4/2002 | Tsern et al. |
| 7,155,623 B2 | 12/2006 | Lefurgy et al. |
| 2003/0065884 A1 | 4/2003 | Lu et al. |
| 2003/0084235 A1 | 5/2003 | Mizuki |
| 2005/0071543 A1 | 3/2005 | Ellis et al. |
| 2005/0259493 A1 | 11/2005 | Walker |
| 2005/0265103 A1 | 12/2005 | Remaklus, Jr. et al. |
| 2006/0087904 A1 | 4/2006 | Pyo et al. |
| 2006/0212651 A1 | 9/2006 | Ashmore |
| 2006/0239096 A1 | 10/2006 | Chu et al. |
| 2008/0037353 A1 | 2/2008 | Rajan et al. |
| 2009/0150621 A1 | 6/2009 | Lee |
| 2010/0095058 A1 | 4/2010 | Proebsting |
| 2012/0033519 A1 | 2/2012 | Confalonieri et al. |
| 2014/0297939 A1 | 10/2014 | Perego et al. |

OTHER PUBLICATIONS

PCT Preliminary Report on Patentability dated Nov. 3, 2011 (Chapter I) in International Application No. PCT/US2010/030166. 8 pages.

PROTOCOL FOR REFRESH BETWEEN A MEMORY CONTROLLER AND A MEMORY DEVICE

BACKGROUND

This application is a continuation of U.S. Utility patent application Ser. No. 17/115,538, filed on behalf of first-named inventor Frederick A. Ware on Dec. 8, 2020, for "Protocol For Refresh Between A Memory Controller And A Memory Device," which in turn is a continuation of U.S. Utility patent application Ser. No. 16/692,069, filed on behalf of first-named inventor Frederick A. Ware on Nov. 22, 2019, for "Protocol For Refresh Between A Memory Controller And A Memory Device" (now U.S. Pat. No. 10,892,001), which in turn is a continuation of U.S. Utility patent application Ser. No. 16/032,575, filed on behalf of first-named inventor Frederick A. Ware on Jul. 11, 2018, for "Protocol For Refresh Between A Memory Controller And A Memory Device" (now U.S. Pat. No. 10,510,395), which in turn is a continuation of U.S. Utility patent application Ser. No. 13/257,412, filed on behalf of first-named inventor Frederick A. Ware on Sep. 19, 2011, for "Protocol For Refresh Between A Memory Controller And A Memory Device" (abandoned), which in turn is a national state filing under 35 U.S.C. § 371 into the United States of Patent Cooperation Treaty Application No. PCT/US2010/030166, filed Apr. 7, 2010, which in turn claims priority to U.S. Provisional Patent Application No. 61/171,576, filed on Apr. 22, 2009. Priority is hereby claimed to the aforementioned patent applications, which are each hereby incorporated by reference.

FIELD

The present embodiments generally relate to integrated circuit memory devices, controller devices and memory systems. More specifically, the present embodiments relate to the design of a protocol for refresh operations between an integrated circuit controller device and an integrated circuit memory device.

DETAILED DESCRIPTION

The disclosed embodiments provide a memory system that facilitates efficient self-refreshing operations, wherein the system may be configured to shut off power and/or shut down clocking to a high-speed interface, but leaves circuitry operating to self-time refreshing operations to maintain the contents of memory cells. In several embodiments, protocols for operating in this self-refresh state may decrease power consumption, which may be attractive in applications such as notebook computers or other portable computing devices for which battery life is important.

In some of the disclosed embodiments, progress information regarding the refresh operation is sent from the memory device to the memory controller during the self-refresh state through a (e.g., uncalibrated, low-power) sideband link. In this way, the uncertainty associated with the timing of the self-refresh operation may be eliminated. For example, in a conventional self-refresh operation, the self-refresh exit delay must account for the worst-case timing of an in-process internal refresh operation (controlled by an internally generated clock that may not be accurate) plus some margin. In contrast, in the disclosed embodiments, the controller can use the progress information received from the memory device to determine when the refresh operation actually completes and can immediately issue a new command to that bank. This enables the memory controller to more optimally control the sequencing of subsequent memory operations to significantly reduce the exit delay from the self-refresh state.

Figure 1:
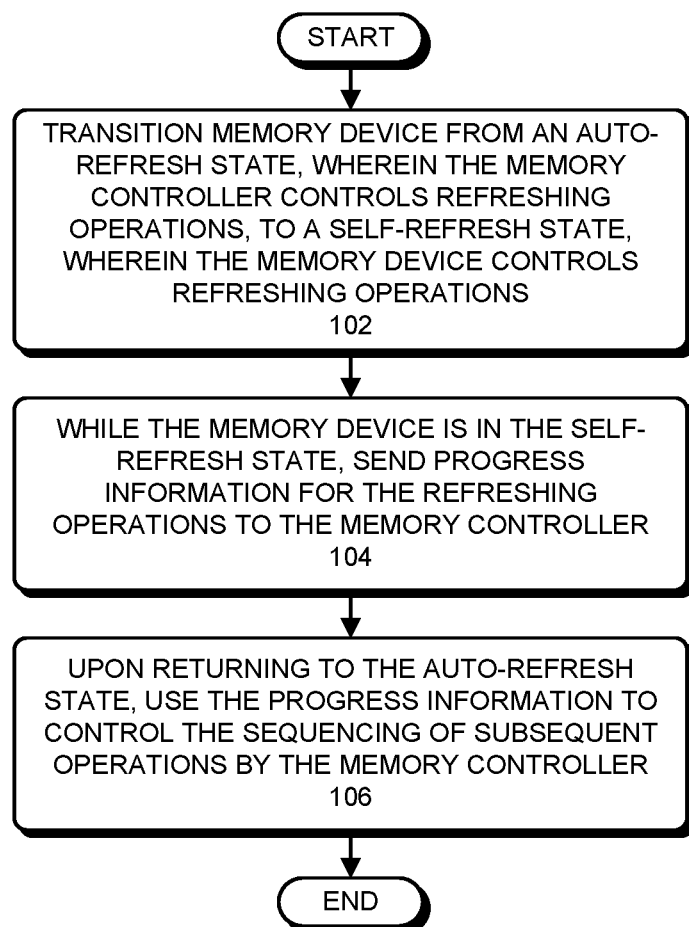
FIG. 1 presents a flow chart illustrating the process of entering and exiting the self-refresh state.

More specifically, referring to the exemplary embodiment depicted in FIG. 1, the memory device first transitions from an auto-refresh state, where the memory controller controls refreshing operations for the memory device, to a self-refresh state, where the memory device controls the refreshing operations internally (operation 102). While the memory device is in the self-refresh state, progress information for the refreshing operations is sent from the memory device to the memory controller (operation 104). Additionally, during the self-refresh state, precharging operations can be overlapped with self-refreshing operations. Next, upon returning from the self-refresh state to the auto-refresh state, the progress information received from the memory device can be used by the memory controller to control the sequencing of subsequent operations by the memory controller (operation 106). In this embodiment, by sending progress information from the memory device to the memory controller, the memory controller does not have to wait for a predetermined or worst-case amount of time to ensure that any in-process self-refresh operation completes before scheduling a subsequent memory operation.

For example, the progress information can be used to determine whether a self-refreshing operation is in process or will occur in the near future. If not, the memory controller can immediately initiate one or more subsequent memory accesses without having to wait for a self-refreshing operation to complete. Additionally, the progress information can be used by the memory controller to determine that a given bank is presently being refreshed. This enables the memory controller to perform memory operations to other banks in the memory device while the self-refreshing operation completes for the given bank.

In one embodiment, the system enters a deep power-down state, wherein the system shuts off power and/or shuts down clocking to a high-speed interface. However, the memory device does not enter a self-refresh state. Instead, the memory controller continues to coordinate refreshing operations through a sideband link. This enables the memory controller to know whether a given bank is being refreshed and to schedule refreshing operations for other banks.

Figure 2:
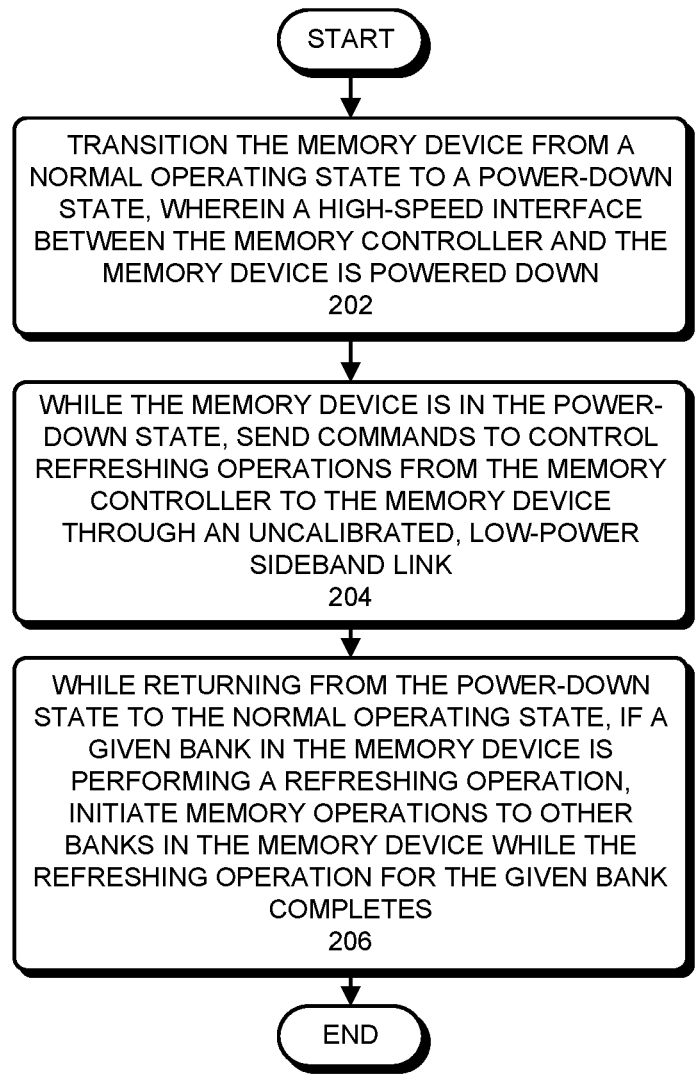
FIG. 2 presents a flow chart illustrating the process of entering and exiting the self-refresh state.

More specifically, referring to FIG. 2, the system first transitions from a normal operating state to a power-down state, wherein a high-speed interface between the memory controller and the memory device is powered down (operation 202). Next, while the memory device is in the power-down state, the system sends commands to control refreshing operations from the memory controller to the memory device (e.g., through an uncalibrated, low-power sideband link) in operation 204. Finally, upon returning from the power-down state back to the normal operating state, if a given bank in the memory device is performing a refreshing operation, the system initiates memory operations to other banks in the memory device while the refreshing operation for the given bank completes (operation 206).

These operations are described in more detail below, but first we describe some details of the memory system.

Memory Controller and Memory Device

Figure 3:
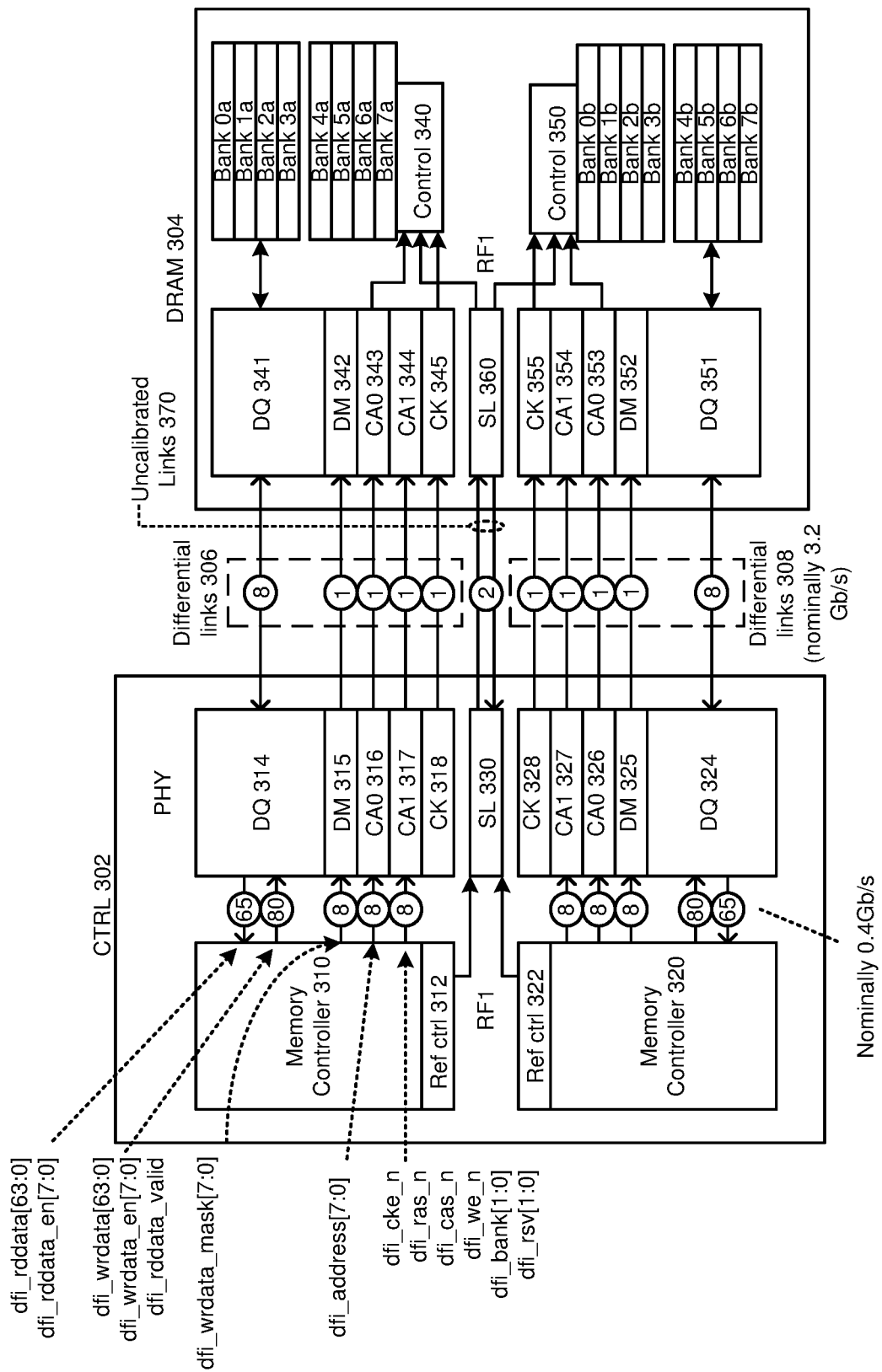
FIG. 3 illustrates an embodiment of a memory controller and a memory device.

FIG. 3 illustrates a memory system including a controller chip (CTRL) 302 and a synchronous type dynamic random access memory device (DRAM) 304 according to an example embodiment. Controller chip 302 includes two sets of memory controller logic, namely memory controller logic 310 and memory controller logic 320. Memory controller logic 310 and 320 include refresh-control circuitry 312 and 322, respectively. This refresh-control circuitry 312 and 322 controls refreshing operations during a normal auto-refresh state. (However, in some embodiments, refresh-control circuitry 312 and 322 control refreshing operations during a power-down state through an uncalibrated, low-power sideband link, which operates through interface circuitry SL 330 on controller chip 302 and SL 360 on DRAM 304.)

DRAM 304 includes two sets of memory banks. The first set includes Bank 0a, Bank 1a, Bank 2a, Bank 3a, Bank 4a, Bank 5a, Bank 6a and Bank 7a, and the second set includes Bank 0b, Bank 1b, Bank 2b, Bank 3b, Bank 4b, Bank 5b, Bank 6b and Bank 7b. During the self-refresh state, refreshing operations for the first set of memory banks are controlled by control circuitry 340 on DRAM 304, and refreshing operations for the second set of memory banks are controlled by control circuitry 350 on DRAM 304.

The memory controller logic on controller chip 302 communicates with the memory banks on DRAM 304 through a number of different interfaces and communications links. More specifically, communications take place between memory controller logic 310 on controller chip 302 and the first set of memory banks on DRAM 304 through (1) interfaces DQ 314, DM 315, CA0 316, CA1 317 and CK 318 on controller chip 302, (2) differential links 306, and (3) interfaces DQ 341, DM 342, CA0 343, CA1 344 and CK 345 on DRAM 304. Similarly, communications take place between memory controller logic 320 on controller chip 302 and the second set of memory banks on DRAM 304 through (1) interfaces DQ 324, DM 325, CA0 326, CA1 327 and CK 328 on controller chip 302, (2) differential links 308, and (3) interfaces DQ 351, DM 352, CA0 353, CA1 354 and CK 355 on DRAM 304.

In this embodiment, controller chip 302 and DRAM 304 additionally communicate refreshing information through an uncalibrated, low-power sideband link which comprises (1) interface SL 330 in controller chip 302, (2) uncalibrated links 370, and (3) interface SL 360 on DRAM 304.

Figure 4A:
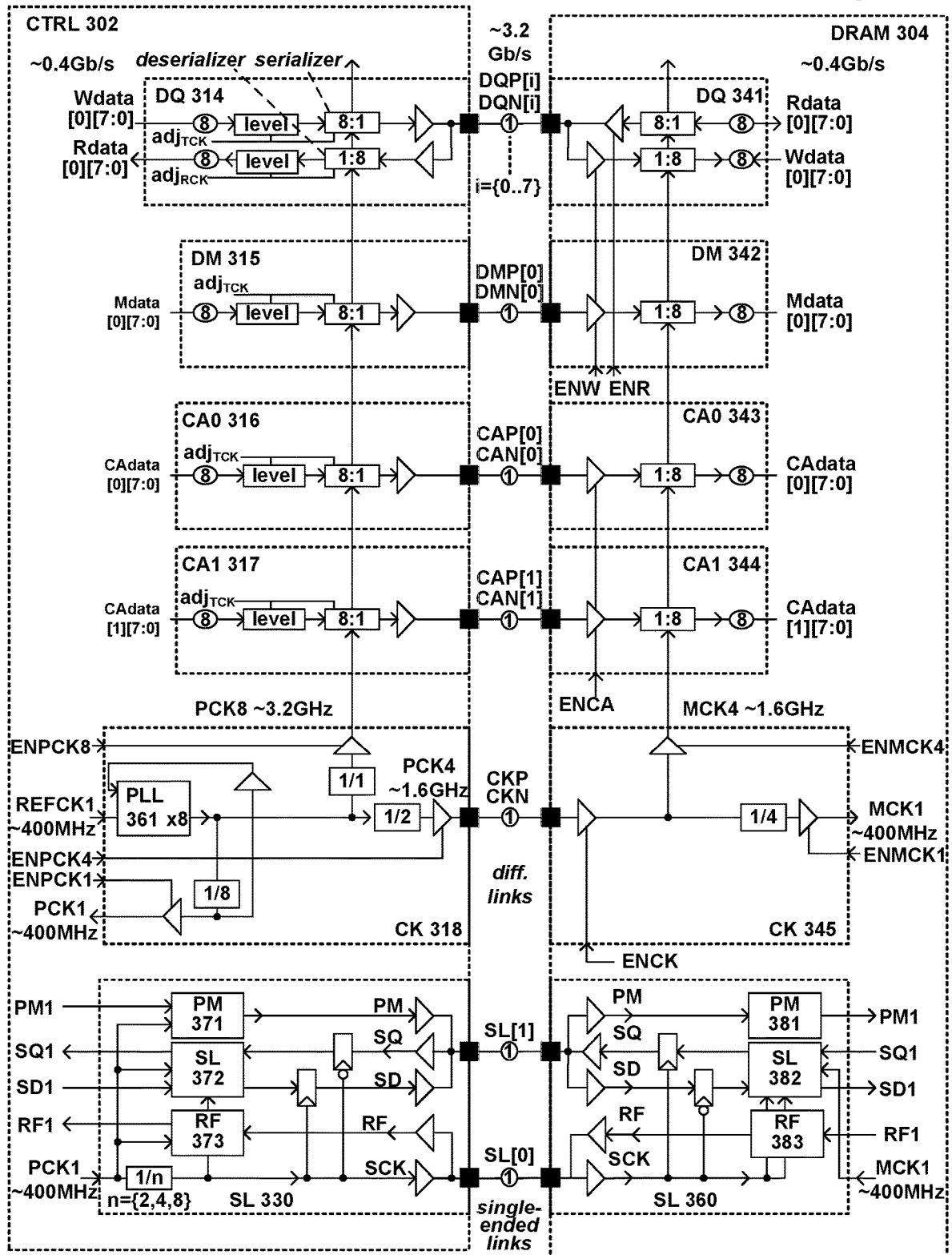
FIG. 4A illustrates communication channels between a memory controller and a memory device.

This interface circuitry of FIG. 3 is illustrated in more detail in an example embodiment shown in FIG. 4A. Referring to FIG. 4A, serializing and de-serializing circuitry is used in interfaces DQ 314, DM 315, CA0 316 and CA1 317 on controller chip 302, and in interfaces DQ 341, DM 342, CA0 343 and CA1 344 on DRAM 304. Moreover, a phase-locked loop (PLL) 361 and other clocking circuitry is used in interface CK 318 on controller chip 302 and associated interface CK 345 on DRAM 304. Interface SL 330 on controller chip 302 includes power-mode logic (PM) circuitry 371 which communicates with corresponding PM circuitry 381 in interface SL 360 on DRAM 304. This power-mode logic circuitry controls changes in the power mode for the memory system. Interface SL 330 additionally includes sideband-link logic circuitry (SL) 372 which communicates with corresponding SL circuitry 382 in interface SL 360 on DRAM 304. This sideband link circuitry facilitates moving control values in the form of read data SQ1 and write data SD1 to and from a control register (not shown) located in DRAM 304. Finally, interface SL 330 includes refresh logic circuitry (RF) 373 which communicates with corresponding refresh logic circuitry (RF) 383 in interface SL 360 on DRAM 304. During a power-down mode, this refresh circuitry sends refreshing commands from DRAM 304 to controller chip 302 through uncalibrated, low-power sideband links SL[0] and SL[1] as is illustrated by signal RF1 in the SL blocks 330 and 360 in FIG. 4A. In contrast, the SCK arrows and triangles remain pointed left-to-right because the SL[1:0] links do not carry SCK, SQ, or SD signals during the deep power-down/self-refresh state, only the RF and PM signals.

Figure 4B:
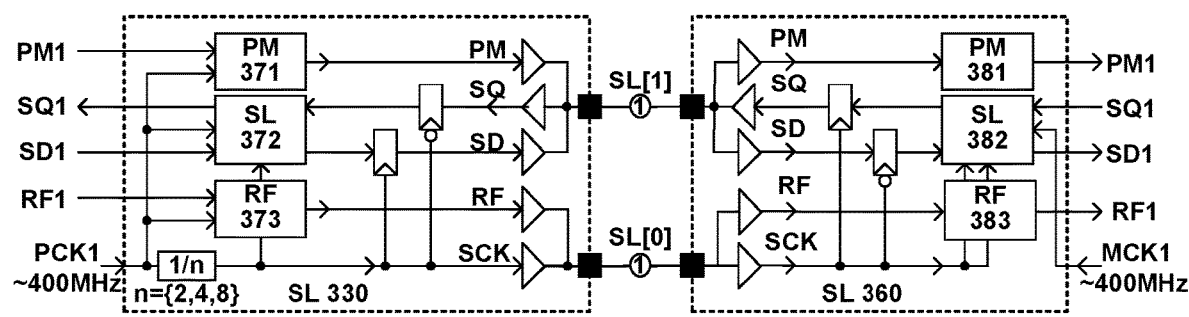
FIG. 4B illustrates an alternative embodiment of a portion of the system in FIG. 4A.

In an alternative embodiment which is illustrated in FIG. 4B, the RF1 signal travels in the opposite direction, from the memory controller to the memory device. In this embodiment, the arrows on the RF1 signal point from left-to-right, and the transmitter and receiver (triangle blocks) also point from left-to-right.

Although the exemplary embodiment disclosed in FIG. 3 includes two sets of memory controllers, two sets of communication interfaces and two memory bank sets, the same techniques can be applied to embodiments that include one memory controller, one set of communication interfaces and one memory bank set.

Timing Diagrams

Figure 5:
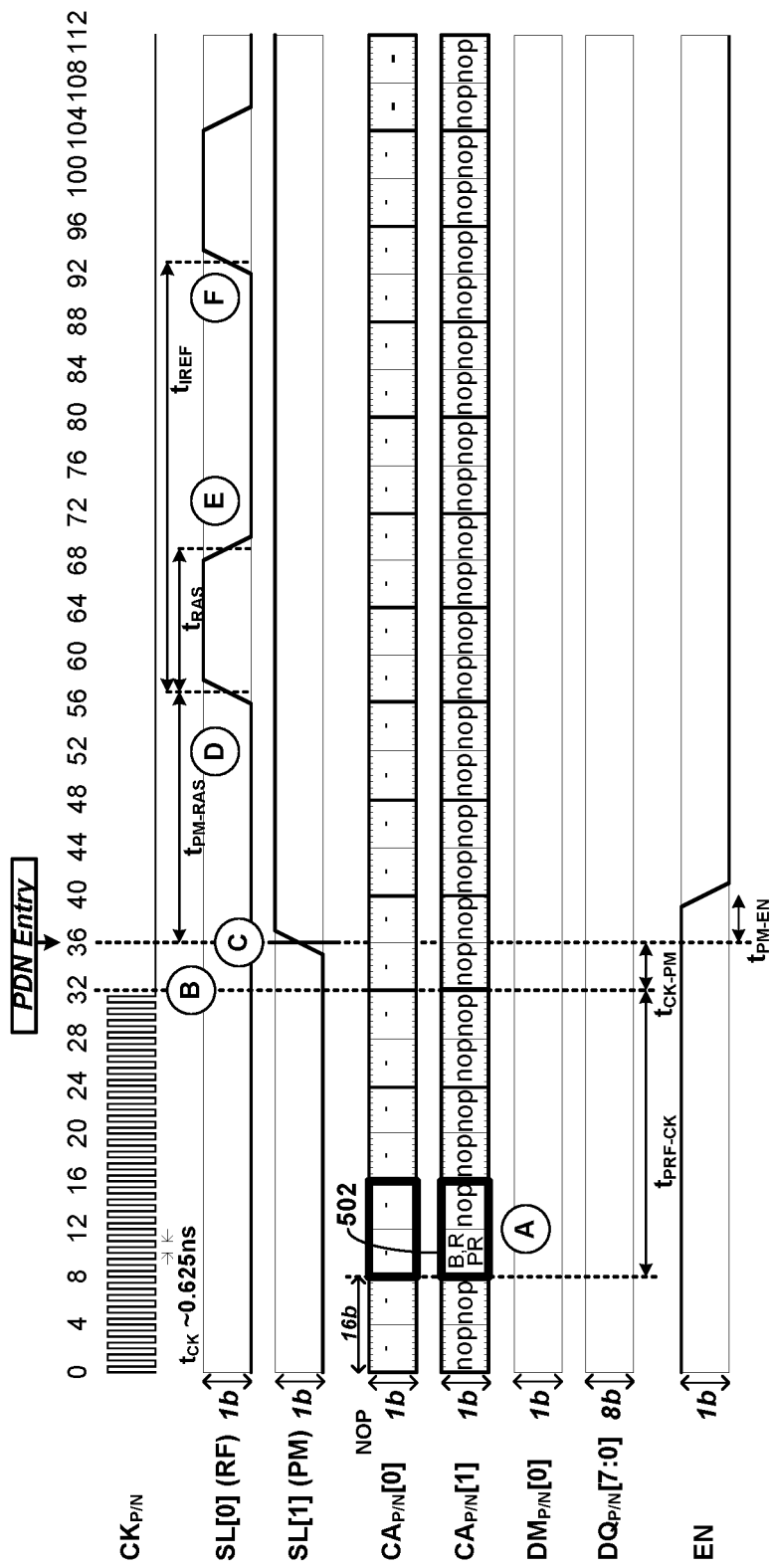
FIG. 5 presents a timing diagram for the process of entering the self-refresh state.

FIG. 5 presents a timing diagram illustrating the process of entering the self-refresh state according to an embodiment. The process starts when the memory controller sends a precharge command (PR) 502 to the memory device, which causes the memory device to precharge an activated row while entering the self-refreshing state. This command includes the starting bank B and row R addresses, as well as the incrementing order (bank-fast or row-fast) (operation A). This bank/row address is represented as "{B,R}". (The term "bank-fast" indicates that the bank address is incremented through all of the banks before the row address is incremented, whereas the term "row-fast" indicates that the row address is incremented through all of the rows before the bank address is incremented.) Next, the controller waits a time $t_{PRF\text{-}CK}$ after the command is transmitted on the CA[1:0] links, and then stops the clock CK (operation B). The controller subsequently changes the power mode (PM) signal on signal line SL[1], which deassserts the enable signals (EN) for the high-speed interface (operation C). This causes the receivers on the DRAM for the CA[1:0], DM, DQ and CK links to be powered down. More specifically, deasserting the EN signal deasserts the ENCA, ENMCK1, and ENMCK4 signals which are illustrated in FIG. 4A. (The ENR and ENW signals are controlled separately by column access commands.)

Next, at a time $t_{PM\text{-}RAS}$ after the PM transition, the memory device starts performing a self-refresh operation, which involves activating the row of memory cells located in the bank as specified by the {B,R} address. The memory device also asserts the refresh (RF) signal on signal line SL[0] to let the memory controller know that the memory device is performing the self-refresh operation (operation D). Next, at a time tRAs after the RF assertion, the memory device precharges the memory cells located in the row in the bank as specified by the {B,R} address, and increments the {B,R} address in bank-fast or row-fast order, depending upon the mode selected by the PR command. The memory device also deasserts the RF signal (operation E). Next, at a time $t_{IREF}$ (the refresh interval) after the previous RF assertion, the memory device starts performing a subsequent self-refresh operation. This involves incrementing the bank and row counters on the memory device to point to the next {B,R} address to be refreshed before commencing the next self-refresh operation. It also involves reasserting the RF signal (operation F).

Figure 6:
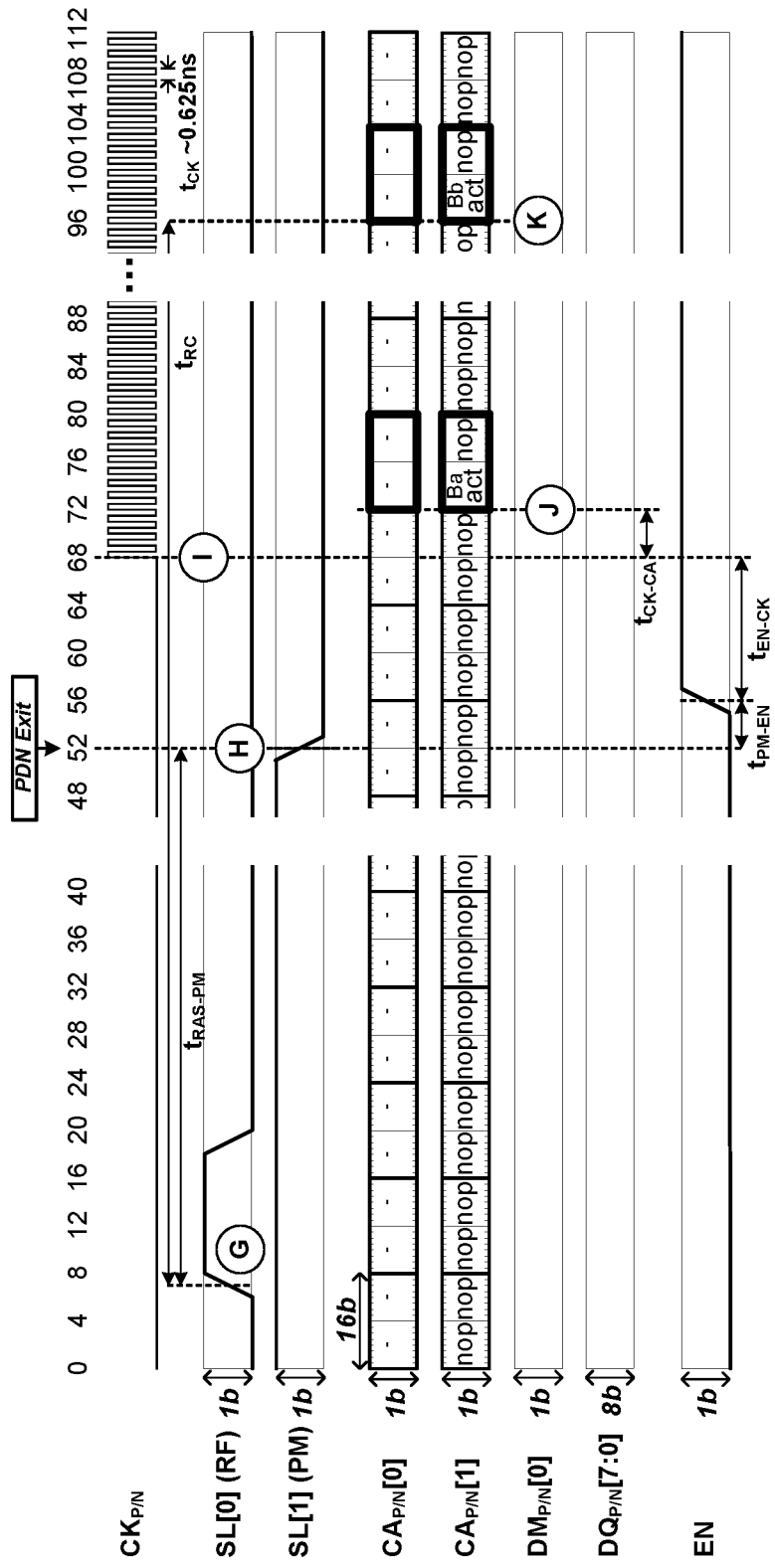
FIG. 6 presents a timing diagram for the process of exiting the self-refresh state.

FIG. 6 presents a timing diagram for the process of exiting the power-down state according to an embodiment. To exit self-refresh during the power-down state, the controller waits a time $t_{RAS-PM}$ after the last RF assertion before deasserting PM (operation G). (This last RF assertion refreshes bank Bb of the memory component.) Next, the PM signal reassserts the EN signals so that the receivers for the CA[1:0] and CK links are powered up (operation H). The clock CK is then restarted a time $t_{PM-EN}+t_{EN-CK}$ after PM is deasserted (operation I). Because the memory controller knows in operation G that the last RF assertion was directed to bank Bb, the memory controller can direct a refresh command to a bank Ba, which is different than the bank Bb that was last refreshed at a time $t_{CK-CA}$ after the clock CK is restarted (operation J). Alternatively, the memory controller can direct a refresh command to a bank Bb that is the same as the bank Bb that was last refreshed at a time $t_{RC}$ after the last assertion of RF (operation K).

In an alternative embodiment illustrated in FIG. 4B, the RF signal is driven in the opposite direction, from the memory controller to the memory device. This embodiment is virtually identical to the embodiment described above, except that the RF signal is initiated by the memory controller, and the SL[0] link carrying the RF signal is reversed. Hence, the timing diagrams in FIGS. 5 and 6 are almost the same for this alternative embodiment, except that some of the timing parameters, namely $t_{PM-RAS}$, $t_{RAS-PM}$ and $t_{RC}$, differ slightly (the difference is only on the order of a few nanoseconds).

In the foregoing description and in the accompanying drawings, specific terminology and drawing symbols are set forth to provide a thorough understanding of the present invention. In some instances, the terminology and symbols may imply specific details that are not required to practice the invention. Consequently, these embodiments may include fewer components or additional components. Moreover, components may be combined into a single component and/or the position of one or more components may be changed.

While the preceding embodiments used a memory system implemented on separate integrated circuits or chips as an illustration, in other embodiments at least portions of either of these chips may be implemented on another integrated circuit. For example, controller chip 302 (FIG. 3) may be included on a processor in a computer system.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Form (CIF), Calma GDS II Stream Format (GDSII) or Electronic Design Interchange Format (EDIF). Those of skill in the art of integrated circuit design can develop such data structures from schematics of the type detailed above and the corresponding descriptions, and can encode the data structures on a computer-readable medium. Those of skill in the art of integrated circuit fabrication can use such encoded data to fabricate integrated circuits comprising one or more of the circuits described herein.

While the present invention has been described in connection with specific embodiments, the claims are not limited to what is shown. For example, in some embodiments the links between controller chip 302 and DRAM 304 in FIG. 3 may utilize half-duplex or full-duplex communication. Similarly, data or commands may be communicated using other encoding or modulation techniques. For example, embodiments of the invention may be adapted for use with multi-pulse-amplitude-encoded (multi-PAM) signals.

Moreover, some components are shown directly connected to one another, while others are shown connected via intermediate components. In each instance, the method of communication establishes some desired electrical communication between two or more circuit nodes, or terminals. Such coupling may often be accomplished using a number of circuit configurations, as will be understood by those of skill in the art. For example, the foregoing embodiments support AC-coupled links, DC-coupled links, or both. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A memory apparatus having a first set of dynamic random access memory (DRAM) banks and a second set of DRAM banks, comprising:
   an interface to receive, from a memory controller, commands for the first set of DRAM banks, including
      a first command to perform a refresh operation in a first bank in the first set of DRAM banks, and
      a second command to access a selected bank of the first set of DRAM banks;
   wherein for the interface, a period is to expire following completion of the refresh operation and prior to receipt of the second command, the period for the first interface being at least
      a first time interval when the first bank and the selected bank are the same bank in the first set of DRAM banks, and
      a second time interval when the first bank and the selected bank are different banks in the first set of DRAM banks; and
   wherein the first time interval is greater than the second time interval; and
   an interface to receive commands, from the memory controller, for the second set of the DRAM banks.

2. The memory apparatus of claim 1, wherein:
   the commands to be received for the second set of DRAM banks include
      a first command to perform a refresh operation in a first bank in the second set of DRAM banks, and
      a second command to access a selected bank of the second set of DRAM banks;
   a period, following completion of the refresh operation in the second set of DRAM banks, prior to receipt of the second command for the second set of DRAM banks, is to be at least a third time interval when the first bank in the second set of banks and the selected bank in the second set of banks are the same bank, and
a fourth time interval when the selected bank in the second set of banks and the first bank in the second set of banks are different banks; and
the third time interval is greater than the fourth time interval.

3. The memory apparatus of claim 2, wherein at least one of the refresh operation in the first bank of the first set of the DRAM banks or the refresh operation in the second set of DRAM banks can be a self- refresh operation.

4. The memory apparatus of claim 3, wherein the memory controller is to specify to the memory apparatus in association with the self-refresh operation a selective incrementing order to be applied in performing the self-refresh operation.

5. The memory apparatus of claim 3, wherein the memory apparatus is to transmit to the memory controller progress information relating to the self-refresh operation, and wherein one of the first time interval, the second time interval, the third time interval, and the fourth time interval is to be selected by the memory controller, dependent on the progress information.

6. The memory apparatus of claim 1, wherein the memory apparatus is to receive commands from the memory controller for the first set of DRAM banks, via a serial, differential communication link, and wherein the memory apparatus is to receive commands from the memory controller for the second set of DRAM banks, also via a serial, differential communication link.

7. The memory apparatus of claim 1, wherein the memory apparatus comprises a first DRAM die and a second DRAM die, wherein the first set of DRAM banks comprises at least one memory bank on the first DRAM die, and wherein the second set of DRAM banks comprises at least one memory bank on the second DRAM die.

8. The memory apparatus of claim 1, wherein a first one of the first set of DRAM banks and the second set of DRAM banks is to be selectively placed into a low power mode, in which the calibrated data transfer between the memory controller and the respective first set of DRAM banks or second set of DRAM banks is disabled, and wherein the memory apparatus is to receive a refresh command directed to a second one of the first set of DRAM banks and the second set of DRAM banks during the low power mode.

9. The memory apparatus of claim 8, wherein the memory apparatus is to send progress information relating to the refresh operation in the first bank of the first set of DRAM banks, via sideband communication, while in the low power mode.

10. The memory apparatus of claim 1, wherein each of the first set of DRAM banks and the second set of DRAM banks is to receive a respective auto-refresh command from the memory controller.

11. A method of operation for a memory apparatus having a first set of dynamic random access memory (DRAM) banks and a second set of DRAM banks, the method comprising:
with an interface, receiving, from a memory controller, commands for the first set of DRAM banks, including
a first command to perform a refresh operation in a first bank in the first set of DRAM banks, and
a second command to access a selected bank of the first set of DRAM banks;

wherein for the interface, a period is to expire following completion of the refresh operation and prior to receipt of the second command, the period for the first interface being at least
a first time interval when the first bank and the selected bank are the same bank in the first set of DRAM banks, and
a second time interval when the first bank and the selected bank are different banks in the first set of DRAM banks; and
wherein the first time interval is greater than the second time interval; and
with an interface, receiving commands, from the memory controller, for the second set of the DRAM banks.

12. The method of claim 11, wherein:
the method further comprises, for the second set of DRAM banks, receiving
a first command to perform a refresh operation in a first bank in the second set of DRAM banks, and
a second command to access a selected bank of the second set of DRAM banks:
a period, following completion of the refresh operation in the second set of DRAM banks, prior to receipt of the second command for the second set of DRAM banks, is to be at least
a third time interval when the first bank in the second set of banks and the selected bank in the second set of banks are the same bank, and
a fourth time interval when the selected bank in the second set of banks and the first bank in the second set of banks are different banks; and
the third time interval is greater than the fourth time interval.

13. The method of claim 12, wherein the memory apparatus comprises a first DRAM die and a second DRAM die, wherein the first set of DRAM banks comprises at least one memory bank on the first DRAM die, wherein the second set of DRAM banks comprises at least one memory bank on the second DRAM die, and wherein the method further comprises receiving the first command to perform the refresh operation in the first bank in the first set of DRAM banks with the first DRAM die and receiving the first command to perform the refresh operation in the first bank of the second set of DRAM banks with the second DRAM die.

14. The method of claim 13, wherein the method further comprises receiving the second command to access the selected bank of the first set of DRAM banks with the first DRAM die and receiving the second command to access the selected bank of the second set of DRAM banks with the second DRAM die.

15. The method of claim 12, wherein at least one of the refresh operation in the first bank of the first set of the DRAM banks or the refresh operation in the second set of DRAM banks is a self-refresh operation.

16. The method of claim 15, wherein the memory controller is to specify to the memory apparatus in association with the self-refresh operation a selective incrementing order to be applied by the in performing the self-refresh operation, and wherein the method further comprises applying the incrementing order.

17. The method of claim 15, further comprising transmitting, to the memory controller, progress information relating to the self-refresh operation, and wherein one of the first time interval, the second time interval, the third time interval, and the fourth time interval is selected by the memory controller, dependent on the progress information.

18. The method of claim 11, further comprising placing a first one of the first set of DRAM banks and the second set of DRAM banks into a low power mode, in which the calibrated data transfer between the memory controller and the respective first set of DRAM banks or second set of DRAM banks is disabled, and receiving, from the memory controller, a refresh command directed to a second one of the first set of DRAM banks and the second set of DRAM banks during the low power mode.

19. The method of claim 18, further comprising sending progress information relating to the refresh operation in the first bank of the first set of DRAM banks to the memory controller, via sideband communication, while in the low power mode.

20. A memory apparatus comprising:
  a first set of dynamic random access memory (DRAM) banks;
  a second set of DRAM banks;
  means for receiving, from a memory controller, commands for the first set of DRAM banks, including
    a first command to perform a refresh operation in a first bank in the first set of DRAM banks, and
    a second command to access a selected bank of the first set of DRAM banks;
  wherein a period is to expire following completion of the refresh operation and prior to receipt of the second command, the period for the first interface being at least
    a first time interval when the first bank and the selected bank are the same bank in the first set of DRAM banks, and
    a second time interval when the first bank and the selected bank are different banks in the first set of DRAM banks; and
  wherein the first time interval is greater than the second time interval; and
  means for receiving commands, from the memory controller, for the second set of the DRAM banks.

* * * * *